United States Patent [19]
Kitch

[11] Patent Number: 5,904,569
[45] Date of Patent: May 18, 1999

[54] METHOD FOR FORMING SELF-ALIGNED VIAS IN MULTI-METAL INTEGRATED CIRCUITS

[75] Inventor: Vassili Kitch, San Ramon, Calif.

[73] Assignee: National Semiconductor Corporation, Santa Clara, Calif.

[21] Appl. No.: 08/923,859

[22] Filed: Sep. 3, 1997

[51] Int. Cl.$^6$ ........................................ H01L 21/00
[52] U.S. Cl. ................ 438/692; 438/737; 438/740; 216/38
[58] Field of Search .................... 438/637, 672, 438/692, 720, 737, 740, 743; 216/17, 18, 19, 38, 39

[56] References Cited

U.S. PATENT DOCUMENTS 4,917,759  4/1990  Fisher .
5,258,096  11/1993  Sandhu .
5,451,543  9/1995  Woo et al. .
5,827,768  10/1998  Lin et al. ........................ 438/692 X Primary Examiner—William Powell
Attorney, Agent, or Firm—Eugene Conser

[57] ABSTRACT

A process for forming a via in a semiconductor device using a self-aligned metal pillar to connect metal layers separated by a dielectric. A first aluminum layer is formed on an oxide layer overlying a semiconductor substrate, a titanium nitride layer is formed on the aluminum layer and finally a second aluminum layer is formed on the titanium nitride layer. In one continuous etching step, the stack of aluminum/titanium nitride/aluminum is then patterned and etched. A first dielectric is deposited overlying the exposed regions of the oxide layer and the formed metal stack. The wafer is then planarized exposing the top of the second aluminum layer. The wafer is again patterned and the second layer of aluminum is etched using the titanium nitride as an etch stop. A second dielectric is deposited to fill the resulting gaps and CMP processes are used to planarize the wafer and expose the top of the aluminum pillar. A third aluminum layer is formed on the overlying dielectric to make electrical contact to the exposed surface of the pillar.

10 Claims, 4 Drawing Sheets

5,904,569

METHOD FOR FORMING SELF-ALIGNED VIAS IN MULTI-METAL INTEGRATED CIRCUITS

TECHNICAL FIELD OF INVENTION

This invention relates generally to a process for fabricating semiconductor devices, and more specifically to processes for forming vias in semiconductor devices using self-aligned metal pillars.

DESCRIPTION OF RELATED ART

Integrated circuits commonly use multi-level metal interconnect as a means for reducing the layout area required for the tens or hundreds of thousands of semiconductor devices that typically form an integrated circuit. This reduction in layout area is possible because the two or more metal layers used in multi-level metal schemes are separated by dielectric layers that allow crisscrossing of the separated metal layers without electrical shorting. Intentional connections between metal layers separated by a dielectric are created by forming small apertures in the dielectric and filling the aperture with a conducting material such as aluminum. These connections are usually made between consecutive metal layers are known as vias.

As semiconductor device geometries continue to shrink into the submicron range, it is increasingly difficult to maintain planar metal and dielectric surfaces during the formation of multi-level metal interconnect. This lack of planarity can cause several problems. For instance, if the underlying topography coated by a photoresist layer contains abrupt steps due to planarity, the photoresist layer's thickness will not be uniform. This can occur, for example, when photoresist is applied to overlie features formed earlier in a semiconductor device process that protrude from the surface of a wafer. Photoresist cannot be applied uniformly over such a topography. This nonuniformity in thickness can lead to some regions of the patterned photoresist layer being inadequately thick to protect underlying features during a later etching step and other regions being excessively thick so that the full thickness of the photoresist layer cannot be exposed due to the depth-of-focus limitations of photolithography at sub-micron dimensions. Also, poor planarity of metal and dielectric layers promotes poor metal step coverage which increases metal sheet-resistance, susceptibility to current-stress failure, electromigration problems, and the probability of electrical opens. In addition, poor planarity in underlying metal or dielectric layers formed earlier in a semiconductor device process further increases the difficulty of establishing planarity in overlying metal or dielectric layers formed later in that process.

Another difficulty associated with via formation for multi-level metal interconnect in sub-micron semiconductor devices is the alignment of upper and lower metal layers with an aperture formed in a dielectric for a via. This alignment is difficult because of the small distance between device features in sub-micron devices and the reduced tolerance available for alignment errors. Misalignment of a via relative to connected upper and lower metal layers can lead to reduced device yield, increased via resistance, and poor metal coverage in the via. For example, in a standard via, misalignment of the via relative to the lower metal layer results in overetching into the dielectric underlying the lower metal layer, thereby increasing the aspect ration of the via opening and preventing adequate step coverage when later filling the via with metal; the result is a poor contact interface in the via and increased via resistance. Misalignment of an upper metal layer relative to a via results in overetching, or notching, of the lower metal layer; the notched lower metal layer exhibits increased current density and is thus more susceptible to failure from electromigration or current stress.

In many semiconductor devices, the layout dimensions of upper and lower metal layers connecting to vias are extended in the vicinity of the via to form a layout frame, or head, around the via. This is known as framing the via, and the frame provides additional alignment margin such that if partial misalignment of an upper and lower metal layer relative to the intended via location occurs, the actual formed via will still overlie a portion of a lower metal layer or underlie a portion of an upper metal layer. However, an adverse effect of using framed vias in a semiconductor device layout is that the packing density is substantially decreased (or the layout area is substantially increased).

A third difficulty associated with via formation for multi-level metal interconnect in sub-micron semiconductor devices is the contact resistance of the vias caused by polymer residue formation during the etching of the vias. These residues are typically formed during plasma etching and may contaminate the bottom of the via thus causing a poor metallurgical contact between the lower metal layer and the metal in the via.

Accordingly, a need existed for a method of forming a via for connecting multi-level interconnect in sub-micron semiconductor devices that improves the surface planarity of formed metal and dielectric layers, reduces problems associated with via misalignment, reduces contact resistance problems associated with polymer residues and lowers associated manufacturing costs.

It is therefore an object of this invention to provide an improved method for forming a via in a semiconductor device.

It is a further object of this invention to provide an improved method for forming a via that reduces problems associated with via misalignment.

Still another object of this invention is to provide an improved method for forming a via that improves yield and reliability.

A still further object of this invention is to provide an improved method for forming a via which improves step coverage.

Another still further object of this invention is to provide an improved method for forming a via which improves contact resistance.

SUMMARY OF THE INVENTION

The foregoing and other objects and advantages of the present invention are achieved, in one specific embodiment, through a process for forming a via in a semiconductor device that uses a self-aligned metal pillar, to connect metal layers separated by a dielectric. A first conductive layer is formed on a semiconductor substrate, a second conductive layer is formed on the first conductive layer and a third conductive layer is formed on the second conductive layer. The three conductive layers are then patterned and etched forming a patterned portion of the first, second and third conducting layers. A first dielectric is deposited, filling the gaps between the patterned portion of the first, second and third conducting layers, overlaying the exposed portion of the semiconductor substrate wherein, the wafer is then planarized, using Chemical Mechanical Processes (CMP), leaving the patterned portion of the third conductive layer exposed.

The wafer is then patterned and the third conductive layer is etched, forming a pillar, using the second conductive layer as an etch stop wherein, the etch chemistry etches the third conductive layer and does not substantially react with the second conductive layer.

A second dielectric layer is deposited to substantially fill the gaps created by the patterning and etching of the third conductive layer.

CMP is used to planarize the wafer and expose the top of the pillar.

A fourth conductive layer is formed on the wafer overlaying the exposed top of the pillar.

DETAILED DESCRIPTION

Figure 1:
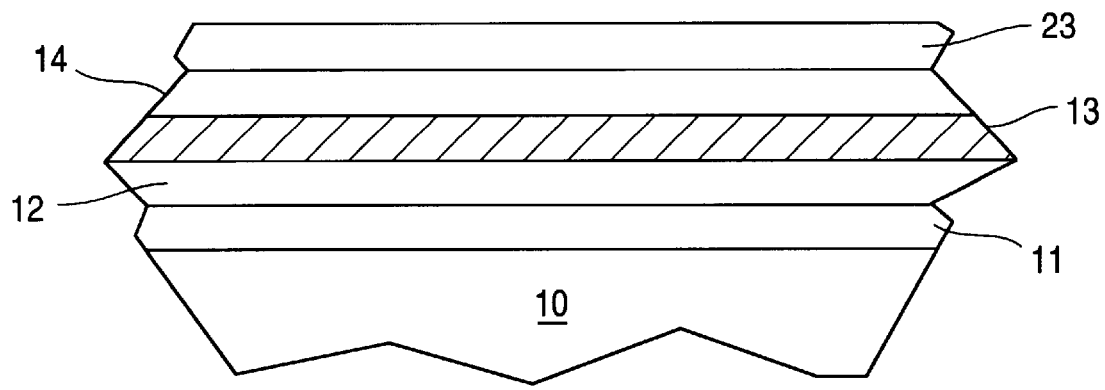
FIGS. 1–6 illustrate process steps, in cross-section, in accordance with one embodiment of the invention.

FIGS. 1–6 illustrate, in cross-section, a process for forming a self-aligned aluminum pillar for use as a via to connect upper and lower layers of metal interconnect in a semiconductor device using double-metal in accordance with one specific embodiment of the invention. In this process, a first oxide layer 11 is deposited overlying a semiconductor substrate 10, and a first aluminum layer 12 is deposited overlying the first oxide layer 11. Next, a layer of titanium nitride 13 is deposited overlying the first aluminum layer 12. Finally, a second layer of aluminum 14 is deposited overlying the titanium nitride layer 13. The first aluminum 12, titanium nitride 13 and the second aluminum 14 stack is patterned and etched leaving a first aluminum portion 25, a titanium nitride portion 26 and a second aluminum portion 27 as desired for the first level of metal interconnect in the first layer of aluminum 12. A second layer of oxide 28 is deposited overlying the exposed first oxide layer 11 and filling the gaps between the first aluminum portion 25, the titanium nitride portion 26 and the second aluminum portion 27 stacks. The wafer is then planarized using a Chemical Mechanical Processes (CMP) to planarize the wafer and expose the top of the top of the second aluminum portion 27. The second aluminum portion 27 is then patterned and etched to form pillar 31, using the titanium nitride portion 26 as an etch stop. A third layer of oxide 32 is deposited overlying the wafer and filling the gaps created by the etching of the second aluminum portion 27. The wafer is then planarized using the CMP to planarize the wafer and expose the top of the pillar 31.

A third layer of aluminum 33 is deposited overlaying the second 28 and third 32 oxide layers to contact the top surface of the pillar 31, thus connecting two levels of metal interconnect in a semiconductor device. It is not required in the method of the invention that the formed pillar be framed by both or either of these metal layers.

Referring to FIG. 1, a first oxide layer 11 is formed overlaying a silicon substrate 10. Even though only first oxide layer 11 is shown formed overlying substrate 10, it is possible for numerous structures such as field oxide regions, polysilicon regions, metal regions and active device regions to underlie first oxide layer 11. These underlying structures do not directly affect the practice of the invention because first oxide layer 11 is planarized using an etch back method, spin on glass (SOG), reflow, CMP or similar processing before forming overlying layers thereon. For example, first oxide layer 11 can be a deposited BPSG layer planarized by an etch back with photoresist as is known. Next in the process, a first aluminum layer 12 is deposited overlying first oxide layer 11, a titanium nitride layer 13 is deposited overlying first aluminum layer 12, and a second aluminum layer 14 is deposited overlying the titanium nitride layer 13. A photoresist layer 23 is deposited on the surface of the second aluminum layer 14.

Figure 2:
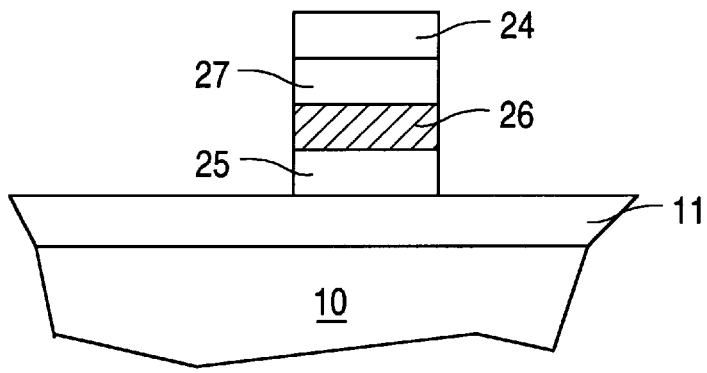

Referring to FIG. 2, photoresist layer 23 has been patterned using conventional photolithography leaving a photoresist portion 24. The first and second aluminum layers 12 and 14 has been anisotropically etched using a chlorine-based chemistry such as $CL_2$, $BCL_3$, or HCL and the titanium nitride layer 13 has been etched using a fluorine based chemistry such as $SF_6$, $CF_4$ or $NF_3$, using photoresist portion 24 as an etch mask, leaving a first aluminum portion 25, with a titanium nitride portion 26 on top of the first aluminum portion 25 and a second aluminum portion 27 on top of the titanium nitride portion in a stack. The pattern etched into first aluminum portion 25 is the pattern desired for the first layer of metal interconnect. Following this etching step, regions of first oxide layer 11 not covered by the first aluminum portion 25 are exposed.

Because photoresist portion 24 must remain intact during the etching of first and second aluminum layers 12 and 14 as well as titanium nitride layer 13, in other embodiments of the invention it may be desirable to use a conventional hard mask to reinforce photoresist portion 24 during this etching process as known in the art.

Figure 3:
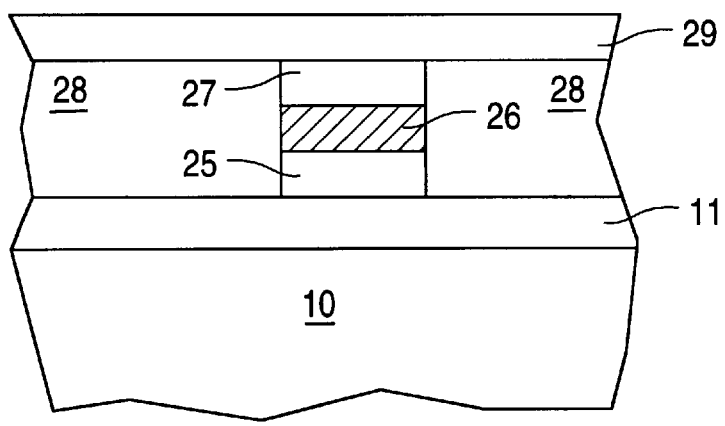

Referring to FIG. 3, second oxide layer 28 is deposited overlying the exposed first oxide layer 11, filling the gaps between the stacked patterned portions of the first and second layers of aluminum and titanium nitride layer 25, 27 and 26 respectively using High Density Plasma (HDP) oxide deposition or SOG. Second oxide layer 28 is then planarized using CMP as known in the art to planarize the surface thereof to expose the top of the stacked patterned portions of the first and second layer of aluminum and titanium nitride layer 25, 27 and 26 respectively. A photoresist layer 29 is deposited on the surface of the planarized second aluminum portion 27 and the second oxide layer 28.

Figure 4:
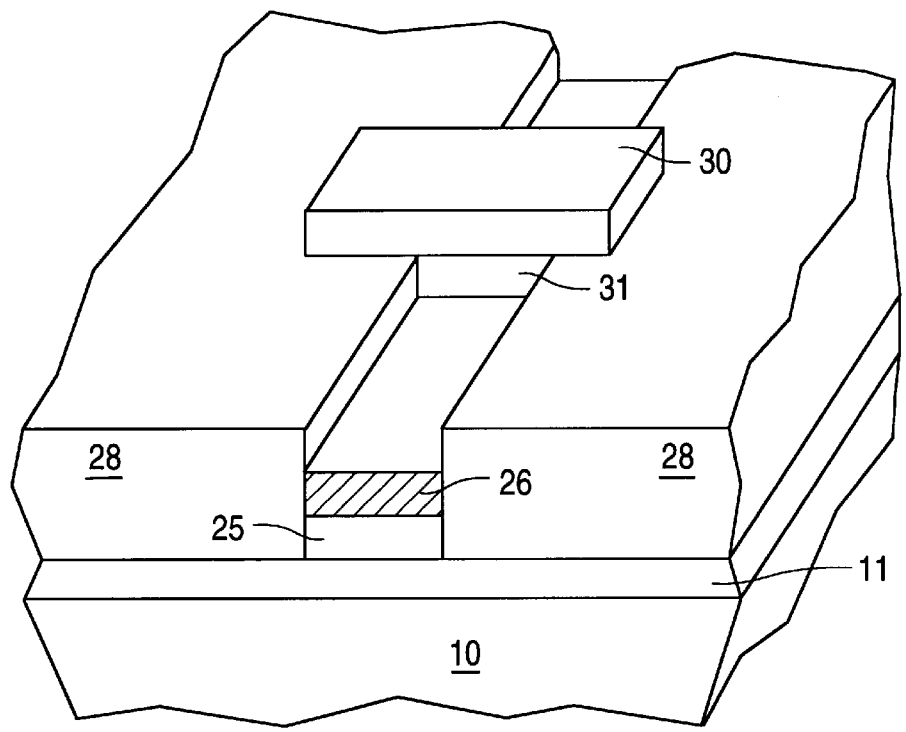

Referring to FIG. 4, photoresist layer 29 has been patterned using conventional photolithography leaving a photoresist portion 30. The second aluminum portion 27 has been anisotropically etched using a chlorine-based chemistry such as $CL_2$, $BCL_3$, or HCL leaving a pillared second aluminum portion 31. The etch chemistry used to etch the second aluminum portion 27 is substantially unreactive with the titanium nitride portion 26, and thus the titanium nitride portion 26 acts as an etch stop during this etching. Following the etching of the second aluminum portion 27, the top surfaces of the titanium nitride portion 26 not covered by the pillared second aluminum portion 31 are exposed. Thus, in accordance with the invention, a self-aligned aluminum pillar has been formed which will connect a first level of metal interconnect and a second level of interconnect to be formed later in the process. The formed aluminum pillar adheres well to the underlying titanium nitride layer with out any induced stresses, in the pillar, thus problems with pillar deformation or flaking are avoided.

Some regions of the top surface of the titanium nitride portion 26 will be exposed after the overlying regions of second aluminum portion 27 not protected by photoresist portion 30 are removed during etching. Although the etch chemistry used is substantially unreactive with titanium nitride, some of the titanium nitride portion 26 will gradually be removed after its top surface is thus exposed. Therefore, titanium nitride portion 26 must be sufficiently thick to protect underlying first aluminum portion 25 until the regions of second aluminum portion 27 are completely etched away. For example, the chemistry selectivity ration for aluminum relative to titanium nitride is about 10:1. Thus, the thickness of titanium nitride portion 26 must be about one-tenth or more the thickness of the over-etch of the second aluminum portion 27 in order to protect the first aluminum portion 25 during etching.

Figure 5:
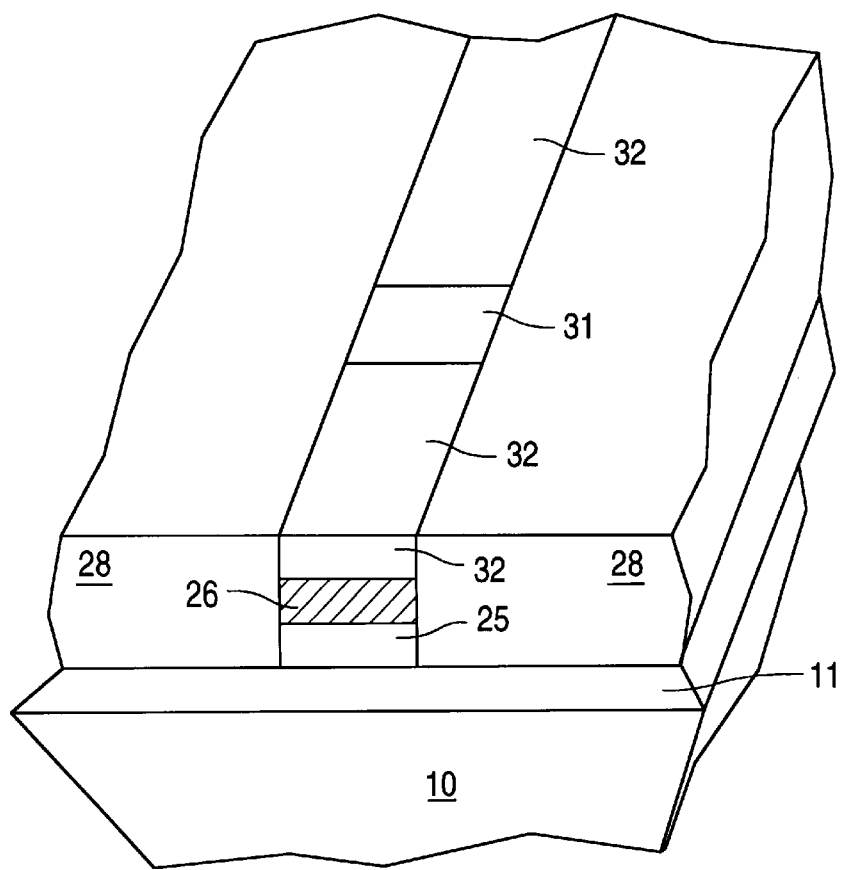

Referring to FIG. 5, a third oxide layer 32 is deposited overlying the exposed titanium nitride portion 26, filling the gaps, resulting from pillared second aluminum portion formation 31, using HDP oxide deposition or SOG. The third oxide layer 32 is then planarized using CMP processes to expose the top of the pillared second aluminum portion 31.

Figure 6A:
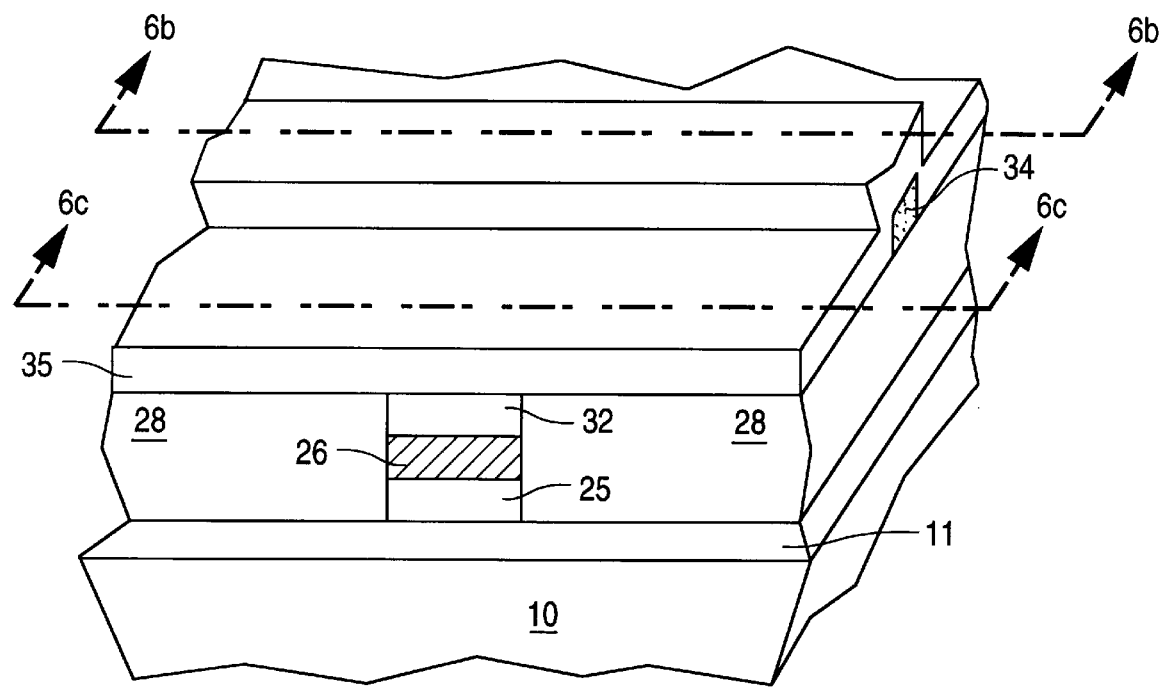
Figure 6B:
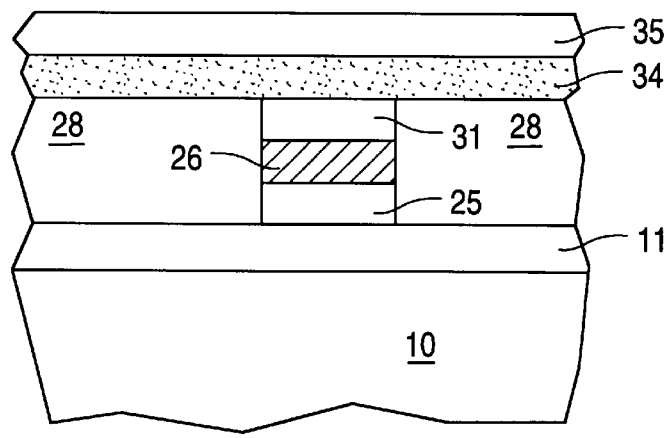
Figure 6C:
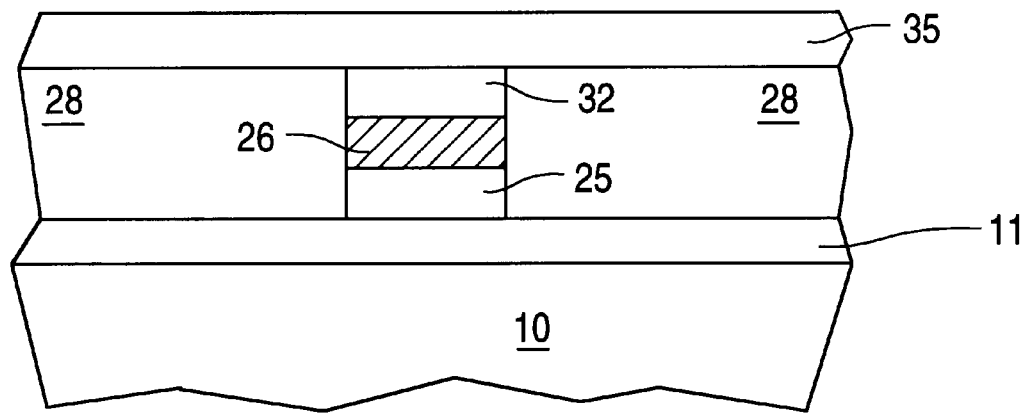

Referring to FIG. 6, a third aluminum layer is deposited overlying the third oxide layer 32 and the exposed surfaces of the pillared second aluminum portion 31 to make electrical contact. The third aluminum layer is then patterned using a photoresist to form an third aluminum portion 34. Because underlying third oxide layer 32 has been planarized and only a relatively thin portion of pillared second aluminum portion 31 protrudes above the surface of third oxide layer 32, the third aluminum layer is deposited with substantially uniform thickness, coverage, and surface planarity. A passivation layer 35 is formed overlying the exposed regions of third oxide layer 32 and third aluminum portion 34.

It should be noted that all metal, photoresist, and dielectric layers deposited in the practice of the invention can be deposited onto substantially planar underlying surfaces or etched back in a planarization step, thus increasing the manufacturability and reliability of the formed semiconductor device. It is well recognized that maintaining planarization during the formation of multi-level interconnection is critical to the successful manufacture of sub-micron semiconductor devices.

Figure 7:
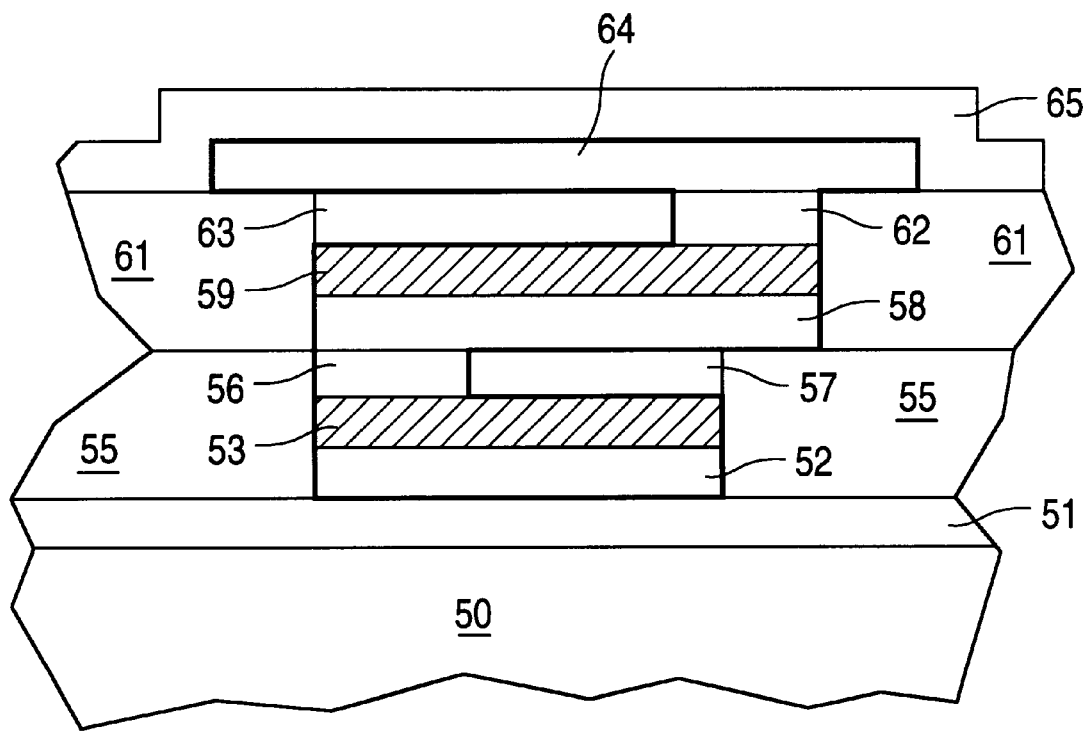
FIG. 7 illustrates a cross-section of a triple layer metal process demonstrating self-aligning advantages of the invention.

FIG. 7 illustrates, in cross-section, a semiconductor device using triple-level metal and two self-aligned aluminum pillars as vias formed in another embodiment of the invention. The first and second vias are formed by essentially the same method as illustrated in FIGS. 1–5 above.

In the embodiment illustrated in FIG. 7, a first oxide 51 is deposited overlying a semiconductor substrate 50. A first aluminum portion 52, a first titanium nitride portion 53 and a second aluminum portion are formed as discussed in the previous embodiment. First aluminum portion 52 overlies first oxide layer 51, first titanium nitride portion 53 overlies first aluminum portion 52, and second aluminum portion overlies first titanium nitride portion 53. A second oxide layer 55 is deposited overlying the exposed regions of first oxide 51. Second oxide layer 55 is then planarized using etch back or a similar process. The second aluminum portion is patterned to form a first pillar 56 overlying the patterned first titanium nitride portion 53. First pillar 56 will be used as a via in the completed device. First aluminum portion 52 is patterned to form a first level of metal interconnect during the same etch which forms first titanium nitride portion 53 and second aluminum portion. A third oxide layer 57 is deposited overlying the exposed regions of first titanium nitride layer 53 and filling the gaps created by the etching of the second aluminum portion to form the first pillar 56. Third oxide layer 57 is then planarized exposing the top of first pillar 56 using a CMP process.

The formation of the second via begins following the planarization of third oxide layer 57 and repeats the method of the invention illustrated for FIGS. 1–6. Third oxide layer 57 has been planarized and provides a suitable surface for forming a second via by this method. To start the formation of the second via, a third aluminum portion 58, a second titanium nitride portion 59 and a fourth aluminum portion are formed overlying third oxide layer 57 and the exposed regions of first pillar 56 to contact the top thereof, using the same method as illustrated in FIGS. 1–6. Third aluminum portion 58 overlies Third oxide layer 57, second titanium nitride portion 59 overlies third aluminum portion 58, and fourth aluminum portion overlies second titanium nitride portion 59. A fourth oxide layer 61 is deposited overlying the exposed regions of third oxide 57. Fourth oxide layer 61 is then planarized using etch back or a similar process. The fourth aluminum portion is patterned to form a second pillar 62 overlying the patterned second titanium nitride portion 59. Second pillar 62 will be used as a via in the completed device. Third aluminum portion 58 is patterned to form a second level of metal interconnect during the same etch which forms second titanium nitride portion 59 and fourth aluminum portion. A fifth oxide layer 63 is deposited overlying the exposed regions of second titanium nitride layer 59 and felling the gaps created by the etching of the fourth aluminum portion to form the second pillar 62. Fifth oxide layer 63 is then planarized exposing the top of second pillar 62 using a CMP process.

A fifth aluminum portion 64 is then formed overlying fifth oxide layer 63 and the exposed regions of second pillar 62 to make electrical contact. Fifth aluminum portion 64 acts as a third level of metal interconnect in the semiconductor device, and a passivation layer 65 is formed overlying the exposed regions of fifth oxide layer 63 and fifth aluminum portion 64.

Thus, in this embodiment, two vias are formed in a semiconductor device having multi-level metal interconnect. In the first via, first pillar 56 is formed without any framing by portions 52 or 53; the horizontal dimension of first pillar 56 is equal to the horizontal dimension of portions 52 and 53. In the second via, second pillar 62 is formed without any framing by portions 58 or 59; the horizontal dimension of second pillar 62 is equal to the horizontal dimension of portions 58 and 59. In addition second pillar 62 is not framed by fifth aluminum portion 64. It is possible to form vias by the present invention which are not framed by either the upper or lower metal layers. This could be advantageous for use in a semiconductor device requiring tight layout because the use of vias not framed by either upper or lower metal layers can substantially increase device packing density.

Although the practice of the invention has been illustrated for double-level and triple-level metal semiconductor devices, the invention can be practiced to form any number of levels of metal interconnect in a multi-level semiconductor device, and such practice is considered to be within the scope of the invention. Also, the dielectric layers used in other embodiments could be any number of low temperature oxides or nitrides such as phosphosilicate glass (PSG), borosilicate glass (BSG), borophosphosilicate glass (BPSG), plasma-enhanced oxide (PEO), Plasma-enhanced nitride (PEN) or low K dielectrics.

In other embodiments of the invention, some or all of the metal layers used in the practice of the invention could be formed from different metals. For example, the pillars could be formed from aluminum, the etch stop metal at the base of the pillars could be formed from tungsten, and the layers of metal interconnect could be formed from titanium or a titanium-tungsten alloy. Aluminum, tungsten, titanium, titanium nitride, tantalum, tantalum nitride, or combinations thereof could be used in other parts of the formed semiconductor device. There are many combinations of metals that all fall within the scope of the invention. The practice of the invention only requires that a conducting metal layer, which acts as an etch stop for an overlying conducting layer, be formed at the base of a pillar-shaped via.

An important advantage of the present invention is the self-alignment of the formed via with the underlying metal. The via of the present invention is formed by depositing a metal layer, removing surrounding metal not protected by photoresist to form a metal pillar, and then depositing dielectric around this formed pillar. On the other hand, in a standard via formation process an aperture is formed in a dielectric layer and then filled with a metal. At sub-micron geometries, forming vias using pillars is preferable to filling apertures with metal because forming pillars provides a solidly-filled metal via whereas filling apertures provides a partially-filled metal via exhibiting poor metal step coverage. This poor step coverage is due to the high aspect ratio necessarily characteristic of an opening formed in a dielectric layer for a sub-micron device. In addition, the elimination of the complicated via etch, via clean, via fill and via to metal alignment reduces the cost of wafer manufacture.

In the above-described embodiments, the method of the invention has been shown to be easily integrated into many processes for manufacturing semiconductor devices. The use of an etch stop layer has been shown to enable the formation of multi-level interconnect and vias with substantial planarization throughout an entire sub-micron semiconductor device fabrication process.

Various other modifications and alterations in the structure and method of fabrication of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. A method for forming a via in a semiconductor device comprising the steps of:
    providing a semiconductor substrate;
    forming a first conducting layer overlying said substrate;
    forming a second conducting layer of a material different from said first conducting layer overlying said first conducting layer;
    forming a third conducting layer of a material different from said second conducting layer overlying said second conducting layer;
    etching said first, second and third conducting layers concurrently to form a patterned portion of said first, second and third conducting layers and exposing portions of said semiconductor substrate;
    depositing a first dielectric layer overlaying said exposed portions of said semiconductor substrate wherein said first dielectric layer fills the resulting gaps created by said etching of said first, second and third conducting layers;
    planarizing said first dielectric layer exposing a top of said patterned portion of said third conducting layer;
    etching a portion of said third conducting layer using said second conducting layer as an etch stop to form a pillar wherein said etching selectively etches said third conducting layer substantially more than said second conducting layer;
    depositing a second dielectric layer wherein said second dielectric layer fills the resulting gaps created by said etching of said third conducting layer; and
    planarizing said second dielectric layer exposing the top of said pillar.

2. The method of claim 1 further comprising the step of forming a fourth conducting layer overlaying said exposed top of said pillar.

3. The method of claim 1 wherein said step of forming said first conducting layer comprises forming a layer selected from the group consisting of aluminum, tungsten, titanium, titanium nitride, tantalum, tantalum nitride, and combinations thereof.

4. The method of claim 1 wherein said step of forming said second conducting layer comprises forming a layer selected from the group consisting of aluminum, tungsten, titanium, titanium nitride, tantalum, tantalum nitride, and combinations thereof.

5. The method of claim 1 wherein said step of forming said third conducting layer comprises forming a layer selected from the group consisting of aluminum, tungsten, titanium, titanium nitride, tantalum, tantalum nitride, and combinations thereof.

6. The method of claim 1 wherein said step of etching said third conducting layer comprises etching anisotropically.

7. The method of claim 1 wherein said step of depositing a dielectric layer comprises depositing a layer selected from the group consisting of High Density Plasma (HDP) oxide and Spin On Glass (SOG).

8. The method of claim 1 wherein said planarizing is a Chemical Mechanical Polish (CMP).

9. A method for forming a via in a semiconductor device comprising the steps of:
    providing a first dielectric layer overlying a semiconductor substrate;
    forming a first conducting layer of a first metal overlying said first dielectric layer;
    forming a second conducting layer of a second metal overlying said first conducting layer;
    forming a third conducting layer of said first metal overlying said second conducting layer;
    etching said first, second and third conducting layers concurrently to form a patterned portion of said first, second and third conducting layers and exposing portions of said first dielectric layer;
    depositing a second dielectric layer overlaying said exposed portions of said first dielectric layer wherein, said second dielectric layer fills the resulting gaps created by said etching of said first, second and third conducting layers;
    planarizing said second dielectric layer exposing a top of said patterned portion of said third conducting layer;
    etching a portion of said third conducting layer using said second conducting layer as an etch stop to form a pillar wherein said etching selectively etches said third conducting layer substantially more than said second conducting layer;
    depositing a third dielectric layer wherein said third dielectric layer fills the resulting gaps created by said etching of said third conducting layer;

planarizing said third dielectric layer exposing the top of said pillar; and forming a fourth conducting layer overlaying said exposed top of said pillar.

10. The method of claim 9 wherein said planarizing is a Chemical Mechanical Polish (CMP).

* * * * *